(12) United States Patent
Kwack et al.

(10) Patent No.: US 7,875,895 B2
(45) Date of Patent: Jan. 25, 2011

(54) ORGANIC LIGHT EMITTING DIODE (OLED) DISPLAY AND METHOD OF MANUFACTURING THE SAME

(75) Inventors: Jin-ho Kwack, Suwon-si (KR); Young-shin Pyo, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 226 days.

(21) Appl. No.: 12/153,495

(22) Filed: May 20, 2008

(65) Prior Publication Data
US 2008/0296600 A1    Dec. 4, 2008

(30) Foreign Application Priority Data
May 30, 2007    (KR)    .................. 10-2007-0052726

(51) Int. Cl.
*H01L 51/50*    (2006.01)
(52) U.S. Cl. ................. 257/98; 257/103; 257/E51.022; 257/E25.008
(58) Field of Classification Search .................. 257/40, 257/642–643, 759, E51.001–E51.052, E25.008–E25.009
See application file for complete search history.

(56) References Cited

U.S. PATENT DOCUMENTS

| 6,379,743 B1 | 4/2002 | Lee et al. | |
| 2001/0005528 A1 | 6/2001 | Lee et al. | |
| 2003/0194484 A1* | 10/2003 | Yamazaki et al. | ............. 427/66 |
| 2004/0140762 A1 | 7/2004 | Tohma et al. | |
| 2005/0146267 A1* | 7/2005 | Lee et al. | .................... 313/506 |
| 2008/0018230 A1 | 1/2008 | Yamada et al. | |

FOREIGN PATENT DOCUMENTS

| JP | 2001-326077 | 11/2001 |
| KR | 10-1999-0031560 | 5/1999 |
| KR | 10-2004-0065183 A | 7/2004 |
| KR | 10-2004-0065554 | 7/2004 |
| KR | 10-2007-0024547 A | 3/2007 |

* cited by examiner

*Primary Examiner*—N Drew Richards
*Assistant Examiner*—Mamadou Diallo
(74) *Attorney, Agent, or Firm*—Lee & Morse, P.C.

(57) ABSTRACT

An organic light emitting display includes a substrate, an OLED including an anode electrode, a cathode electrode and an organic thin film formed between the anode electrode and the cathode electrode, a reflective layer on the OLED, the reflective layer comprising a laminated first material and second material, the first material and the second material having different refractive indices, and an encapsulation layer on the reflective layer, the encapsulation layer comprising at least one of organic thin film and inorganic thin film.

13 Claims, 5 Drawing Sheets

ORGANIC LIGHT EMITTING DIODE (OLED) DISPLAY AND METHOD OF MANUFACTURING THE SAME

BACKGROUND OF THE INVENTION

1. Field of the Invention

Embodiments relate to an organic light emitting diode (OLED) display and a method of manufacturing the same. More particularly, embodiments relate to an OLED display that may be less susceptible to deterioration of electrical characteristics due to ultraviolet (UV) radiation than conventional displays, and a method of manufacturing the same.

2. Description of the Related Art

In general, organic light emitting diode (OLED) displays exhibit self-emission characteristics, i.e., self-luminous, and have higher performance in terms of wider viewing angle, higher brightness and contrast, near instantaneous response speed, and low power consumption with thin and compact form factor over liquid crystal displays (LCDs).

An OLED display includes a plurality of OLEDs coupled between a matrix of scan lines and data lines to form a plurality of pixels. An OLED includes an anode electrode, a cathode electrode, and an organic thin film layer formed between the anode electrode and the cathode electrode. An OLED further includes a hole transport layer, an organic light emitting layer, and an electron transport layer. If a given voltage is applied to the anode electrode and the cathode electrode, the holes injected through the anode electrode and the electrons injected through the cathode electrode are re-coupled with each other in the organic light emitting layer. As a result, light is emitted due to a difference in energy.

Since OLED displays include organic materials, OLED displays are vulnerable to attack by hydrogen or oxygen. Additionally, since the cathode electrode is made of a metal material, the cathode electrode may be easily oxidized by moisture in the air which leads to deterioration in electrical and light emitting characteristics. In order to prevent electrical and light emitting characteristics from deteriorating, a can or cup shaped container made of a metal material, or a sealing substrate made of glass or plastic is typically provided on a substrate on which the OLED may be formed. The container or sealing substrate and substrate are then sealed via a sealant such as epoxy-based sealants.

It is difficult, however, to apply such a configuration to a thin or flexible OLED display. Accordingly, in order to seal a thin or flexible OLED display, a thin film encapsulation technology may be employed. Ultraviolet (UV) radiation is typically used in employing thin film encapsulation technology to form OLED displays. If UV radiation is irradiated onto the organic thin film layer, however, thermal damage is generated. Such thermal damage negatively affects and changes the characteristics of the organic thin film layer, and surface characteristics between the organic thin film layer and the cathode electrode are also negatively affected. Accordingly, there remains a need to address one or more of these drawbacks and disadvantages of the related art.

SUMMARY OF THE INVENTION

Embodiments are therefore directed to an OLED display that may address one or more of the drawbacks and disadvantages of the related art.

It is therefore a feature of an embodiment of the present invention to provide an OLED display having a reduced change in the electric characteristics caused by UV radiation.

At least one of the above and other features of the present invention may be realized by providing an OLED display including a substrate, an OLED including an anode electrode, a cathode electrode and an organic thin film formed between the anode electrode and the cathode electrode, a reflective layer on the OLED, the reflective layer comprising a laminated first material and second material, the first material and the second material having different refractive indices, and an encapsulation layer on the reflective layer, the encapsulation layer comprising at least one of organic thin film and inorganic thin film.

The refractive indices of the first material and the second material of the reflective layer may have a relative difference within a range of approximately 1.2 to 4.0. The first material of the reflective layer may include one or more of a photo acryl, $BaF_2$, CsF, $Na_5Al_3F_{14}$, KCl, SiO, and $Alq_3$, and the second material of the reflective layer may include one or more of a silicone nitride (SiN), $Cu_2O$, $Fe_2O_3$, $TiO_2$, and ZnSe.

The organic thin film of the encapsulation layer may include an ultraviolet radiation curing material. The optical thickness of the first material and the second material of the reflective layer may be about $\lambda/4$ of a wavelength of ultraviolet radiation used to cure the organic film of the encapsulation layer.

The OLED may further include a thin film transistor formed on the substrate and coupled with the anode electrode. Further, the cathode electrode may be translucent.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
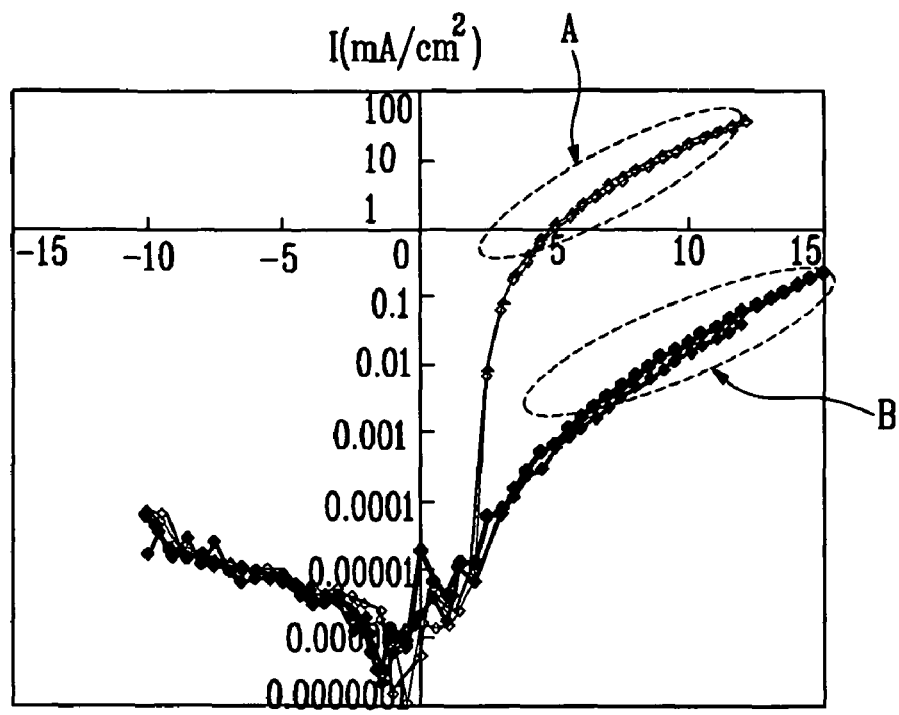
FIG. 1 illustrates a graph of a change in the electric characteristics (I-V) of an OLED that may be caused by UV radiation.

Korean Patent Application No. 10-2007-0052726, filed on May 30, 2007, in the Korean Intellectual Property Office, and entitled: "Organic Light Emitting Display and Method of Manufacturing the Same" is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Further, like reference numerals refer to like elements throughout.

FIG. 1 illustrates a graph including curve A and curve B. Curve A illustrates a measurement result before UV irradiation of the OLED and curve B illustrates a measurement result after UV irradiation of the OLED. As illustrated in the graph of FIG. 1, if UV radiation is irradiated onto the organic thin film layer of the OLED, thermal damage may be generated. The thermal damage may change the characteristics of the organic thin film layer and surface characteristics between the organic thin film layer and a cathode electrode. This may result in electric characteristics (I-V-L) of the OLED being positively shifted, or may result in leakage current being generated in the OLED. This may result in a higher voltage being required in order to obtain the same brightness (cd), and/or may result in a reduction in life of the OLED, for example.

Figure 2:
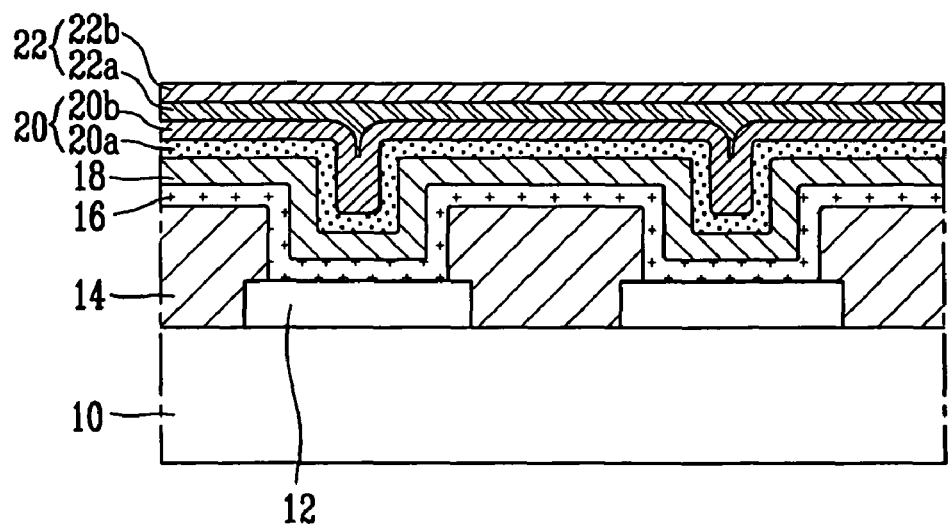
FIG. 2 illustrates a sectional view of an OLED display according to a first embodiment of the present invention.

FIG. 2 illustrates a sectional view of a passive matrix type OLED including an OLED formed on a substrate 10. A reflective layer 20 is formed on the OLED, the reflective layer including one or more laminated substances with different refractive indices. An encapsulation layer 22 is formed on the reflective layer 20 to seal or encapsulate the OLED.

The OLED may include an anode electrode 12 formed on the substrate 10 and arranged in a first direction. The OLED may include a cathode electrode 18 formed in a second direction approximately perpendicular to the first direction to cross the anode electrode 12. An organic thin film 16 may be formed between the anode electrode 12 and the cathode electrode 18. Although not illustrated in detail, the organic thin film 16 may include a structure in which a hole transport layer, an organic light emission layer, and an electron transport layer may be laminated. The organic thin film 16 may further include a hole injection layer and an electron injection layer. The OLED may further include an insulation layer 14. The insulation layer 14 may be formed from an organic or an inorganic substance.

The reflective layer 20 may include a dual layer structure in which substances with different refractive indices such as a thin film 20a with a low refractive index and a thin film 20b with high refractive index may be laminated.

Although reflective layer 20 is depicted as having a dual layer structure, it is not limited thereto, and the reflective layer 20 may be a multi-layer structure including more than two layers or may be formed from a single layer, for example.

Moreover, the encapsulation layer 22 may include a lamination of an organic thin film 22a and an inorganic thin film 22b. Although only a dual layer of the organic thin film 22a and the inorganic thin film 22b is depicted in the drawings, it is not limited thereto and the encapsulation layer 22 may be formed in the multi-layer structure or may be formed from a single layer, for example.

Figure 3:
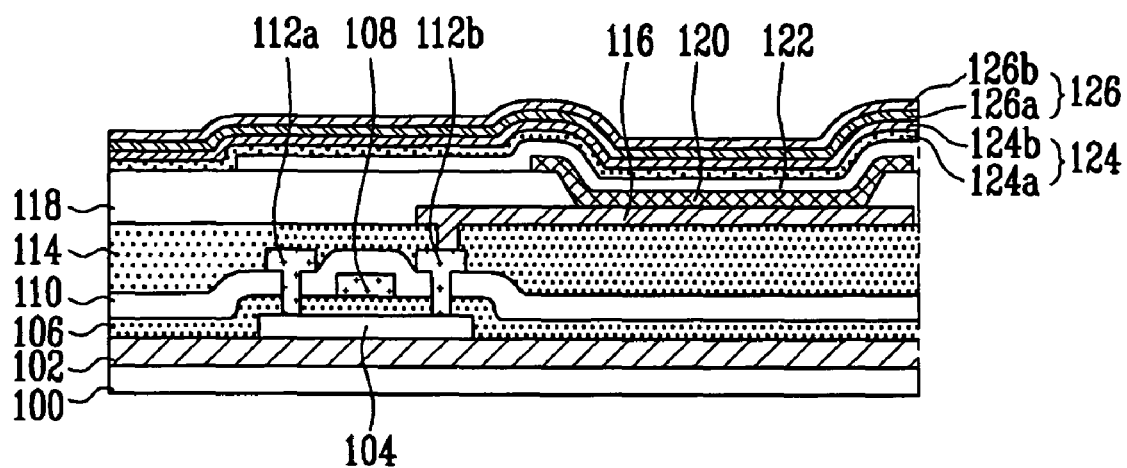
FIG. 3 illustrates a sectional view of an OLED display according to a second embodiment of the present invention.

FIG. 3 illustrates a sectional view of an OLED display, and may be an active matrix type OLED display in which respective pixels are controlled by a thin film transistor (TFT). Further, the OLED display illustrated in FIG. 3 may illustrate one OLED of the OLED display. The active matrix type OLED display illustrated in FIG. 3 includes a TFT formed on a substrate 100, and an OLED coupled with the TFT. The active matrix type OLED display further includes a reflective layer 124 formed on the OLED, the reflective layer 124 including a laminated structure of substances with different refractive indices. The active matrix type OLED display further includes an encapsulation layer 126 for sealing the OLEDs of the OLED display.

The TFT may include a semiconductor layer 104 for providing a channel region and a source and drain region. The TFT may further include a gate electrode 108 formed on the semiconductor layer 104 in the channel region and insulated from the semiconductor layer 104 by an insulation layer 106. The TFT may further include source and drain electrodes 112a and 112b, which may contact the source and drain regions of semiconductor layer 104 via contact holes formed in interlayer insulation layer 110.

The OLED may include an anode electrode 116 coupled with the source electrode 112a or the drain electrode 112b, but illustrated here as contacting the drain electrode 112b. The anode electrode may be coupled to the source electrode 112a or the drain electrode 112b through a via hole formed in a flattening layer 114.

The OLED may further include an organic thin film layer 120 formed on the anode electrode 116 in a light emitting region exposed by a pixel definition layer 118, and a cathode electrode 122 formed on the pixel definition layer 118 including the organic thin film layer 120. The organic thin film layer 120 may be formed by laminating a hole transport layer, an organic light emitting layer, and an electron transport layer (not shown), and may further include a hole injection layer and an electron injection layer (not shown). The OLED may further include a buffer layer 102 formed on the substrate 100 and a gate insulation layer 106 formed on the upper side containing the semiconductor layer 104. The OLED may further include an interlayer insulation layer 110 formed on the insulation layer 106 and the gate electrode 108.

The reflective layer 124 may include a laminated structure of substances with different refractive indices, such as a thin film 124a with a low refractive index and a thin film 124b with a high refractive index. Conversely, the reflective layer 124 may include a thin film 124a with a high refractive index and a thin film 124b with a low refractive index. Although a dual layer type refractive layer 124 is depicted in the drawings, it is not limited thereto and may be a multi-layer structure or may be formed from a single layer, for example.

Moreover, the encapsulation layer 126 may include a laminated organic thin film 126a and an inorganic thin film 126b or may include an inorganic thin film 126b and an organic thin film 126a. Although only dual layer of the organic thin film 126a and the inorganic thin film 126b is depicted in the drawings, it is not limited thereto and the encapsulation layer 126 may be a multi-layer structure, may be formed from a single layer or may include at least one of organic thin film and an inorganic thin film, for example.

Hereinafter, embodiments of a method of fabricating an OLED display according to the present invention will be described in detail with reference to FIGS. 4A to 4D and 5A to 5E.

Figure 4A:
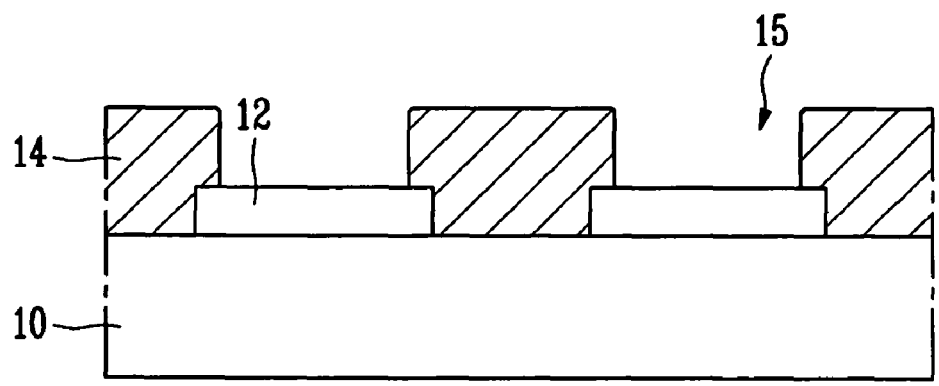
FIGS. 4A to 4D illustrate sectional views of a method of fabricating an OLED display according to the first embodiment of the present invention.

Referring to FIG. 4A, anode electrodes 12 may be arranged on substrate 10 in a first direction. An insulation layer 14 may be formed from organic or inorganic substances on the entire upper surface of substrate 10. The insulation layer 14 may be patterned to form openings 15 such that portions of anode electrodes 12 in a light emitting region are exposed.

Figure 4B:
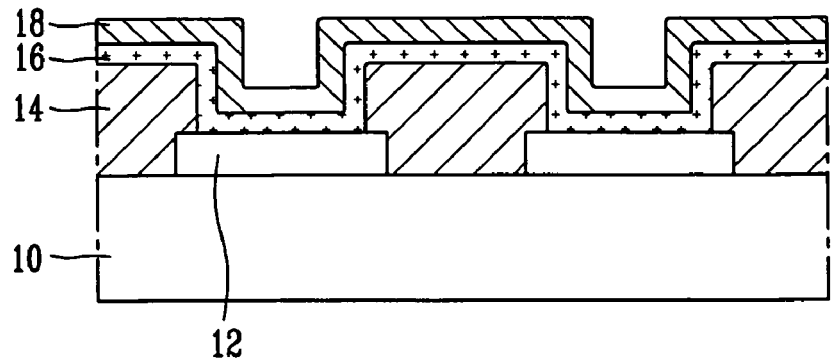

Referring to FIG. 4B, partitions (not shown) may be formed on insulation layer 14 in a second direction which may be perpendicular with the first direction, such that the partitions cross anode electrodes 12 on substrate 10. An organic thin film 16 may be formed on an insulation layer 14 and may cross anode electrodes 12 in a light emitting region, for example. In one embodiment, organic thin film 16 and the cathode electrodes 18 may be separated by the partition (not shown).

Figure 4C:
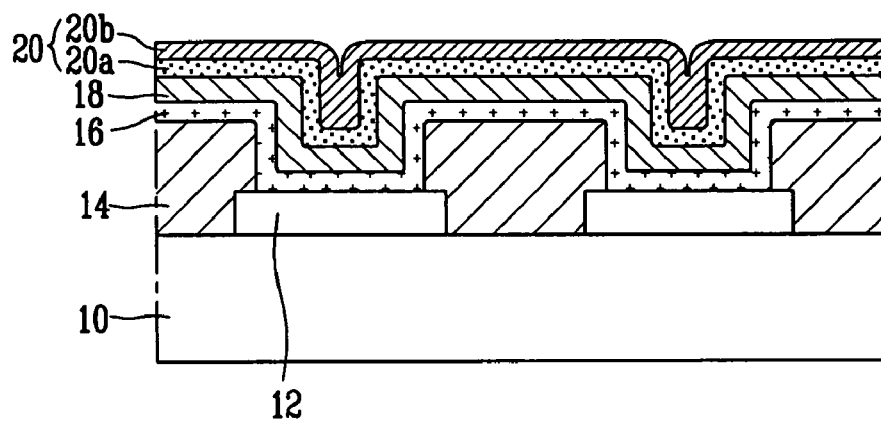

Referring to FIG. 4C, a reflective layer 20 may be formed on cathode electrode 18. Reflective layer 20 may comprise substances with different refractive indices, for example a thin film 20a with a low refractive index and a thin film 20b with a high refractive index. Alternatively, reflective layer 20 may comprise a thin film 20b with a high refractive index and a thin film 20a with a low refractive index may be laminated on the cathode electrode 18 to form a reflective layer 20.

Figure 4D:
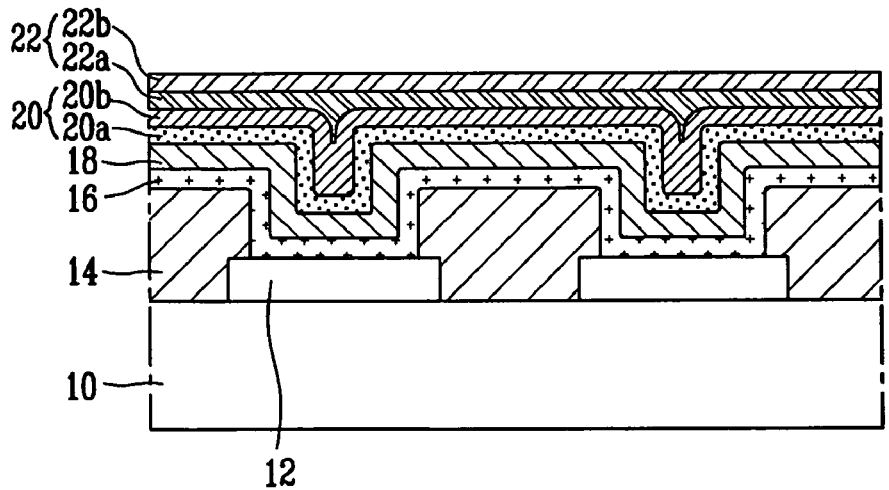

Referring to FIG. 4D, a laminated encapsulation layer 22 may be formed on reflective layer 20. Laminated encapsulation layer 22 may include an organic thin film 22a and an inorganic thin film 22b, or alternatively may include an inorganic thin film 22b and an organic thin film 22a. If thin film 22a is an organic thin film, organic thin film 22a may serve to flatten a surface and the inorganic thin film 22b, and may prevent or reduce the permeation of moisture and/or oxygen. The organic thin film 22a may be made of ultraviolet curing material. For example, the organic thin film 22a may include liquid monomer vapor-deposited and cured by ultraviolet radiation.

Figure 5A:
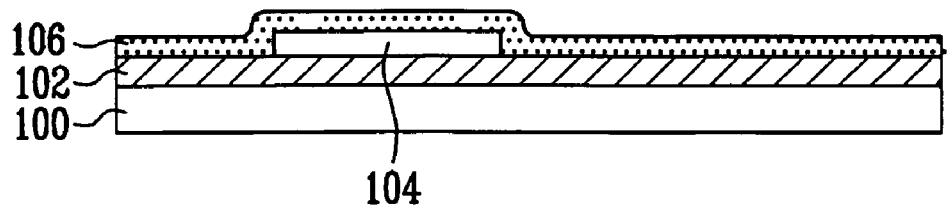
FIGS. 5A to 5E illustrate sectional views of a method of fabricating an OLED display according to the second embodiment of the present invention.

Referring to FIG. 5A, a buffer layer 102 is formed on substrate 100, and a semiconductor layer 104 is formed on a portion of buffer layer 102. The semiconductor layer may be utilized to form a channel region, a source region and/or a drain region. A gate insulation layer 106 may be formed on the upper side containing the semiconductor layer 104.

Figure 5B:
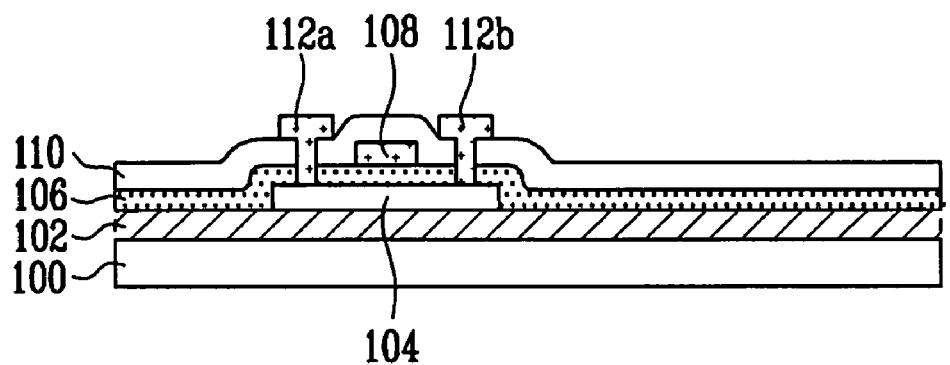

Referring to FIG. 5B, a gate electrode 108 may be formed on the portion of the gate insulation layer 106 overlying the semiconductor layer 104. An interlayer insulation layer 110 may be formed on the gate insulation layer 106 and the gate electrode 108. The interlayer insulation layer 110 and the gate insulation layer 106 may be patterned to form contact holes to enable formation of source and drain electrodes. Source and drain electrodes 112a and 112b may be formed to contact the semiconductor layer 104 via the contact holes.

Figure 5C:
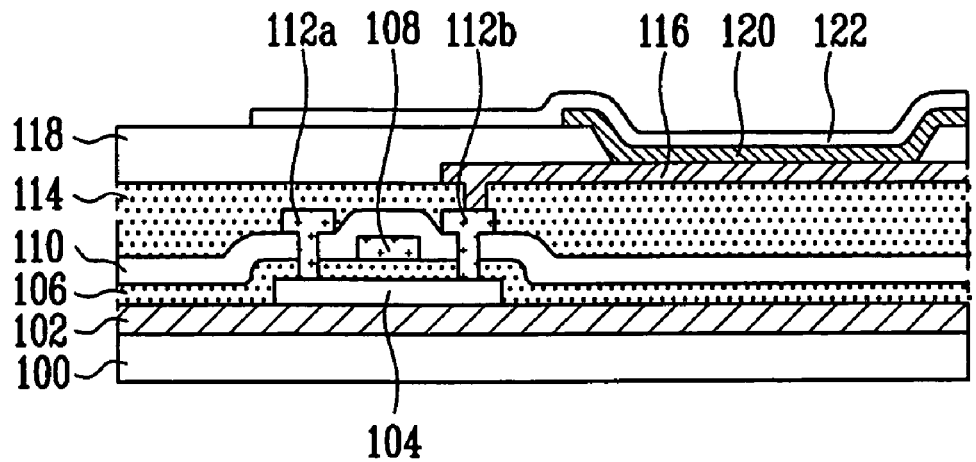

Referring to FIG. 5C, a flattening layer 114 may be formed on the upper surface to flatten the upper surface. The flattening layer 114 may be patterned to form via holes (not shown) such that portions of the source or drain electrode 112a or 112b may be exposed. An anode electrode 116 may be formed to contact the source or drain electrode 112a or 112b through the via holes, but illustrated here as contacting the drain electrode 112b. A pixel definition layer 118 may be formed on the flattening layer 114 such that a portion of the anode electrode 116 in a light emitting region may be exposed. An organic thin film layer 120 may be formed on the exposed portion of the anode electrode 116. Cathode electrode 122 may be formed on a portion of the pixel definition layer 118 and the organic thin film layer 120.

Figure 5D:
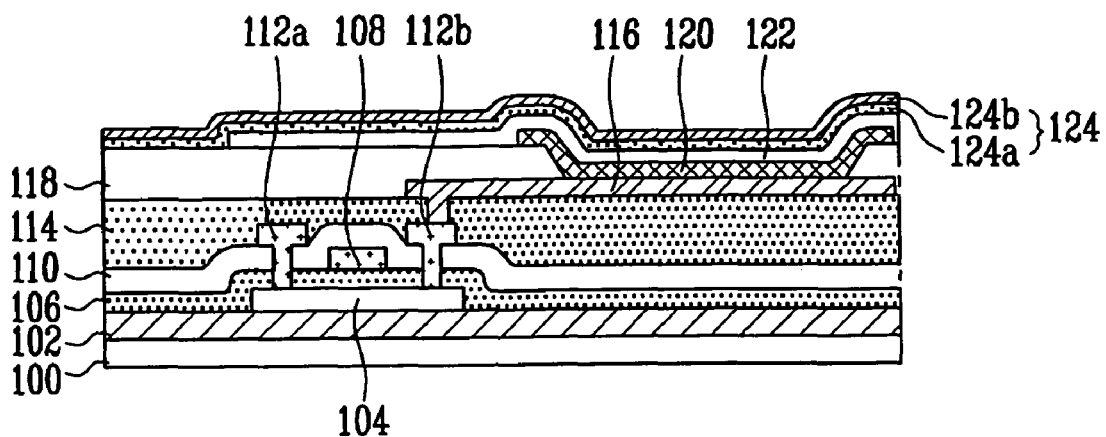

Referring to FIG. 5D, reflective layer 124 may be formed on cathode electrodes 122. Reflective layer 124 may comprise substances with different refractive indices, for example a thin film 124a with a low refractive index and a thin film 124b with a high refractive index. Alternatively, reflective layer 124 may include a thin film 124b with a high refractive index and a thin film 124a with a low refractive index that may be laminated on the cathode electrodes 122 to form a reflective layer 124.

Figure 5E:
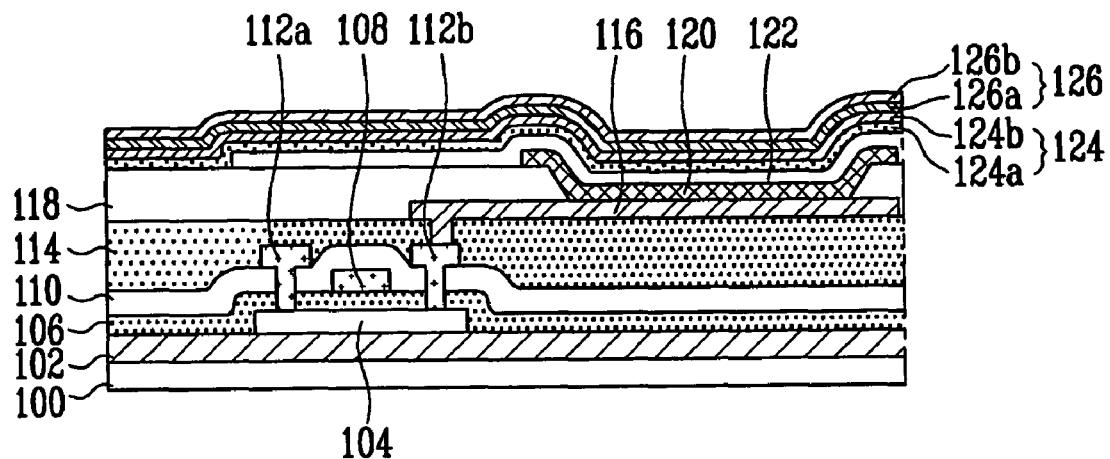

Referring to FIG. 5E, a laminated encapsulation layer 126 may be formed on reflective layer 124. Laminated encapsulation layer 126 may include an organic thin film 126a and an inorganic thin film 126b or, alternatively, may include an inorganic thin film 126b and an organic thin film 126a. If thin film 126a is an organic thin film, organic thin film 126a may serve to flatten a surface and the inorganic thin film 126b, and may prevent or reduce the permeation of moisture and/or oxygen. The organic thin film 126a may be made of ultraviolet curing material. For example, the organic thin film 126a may include liquid monomer vapor-deposited and may be cured by ultraviolet radiation.

As described above, embodiments may form the reflective layers 20 and 124 by laminating the thin films 20a and 124a with a low refractive index and the thin films 20b and 124b with a high refractive index on the upper side of the OLED display. In this case, the refractive indices R of the reflective layers 20 and 124 may be expressed by the following Formula 1:

$$R = \left| \frac{\left(\frac{nL}{nH}\right)^{2N} - n_s}{\left(\frac{nL}{nH}\right)^{2N} + n_s} \right|^2 \quad \text{Formula 1}$$

where nL denotes refractive indices of the thin films 20a and 124a, nH denotes refractive indices of the thin films 20b and 124b, and $n_s$ denotes refractive indices of glass substrates 10 and 100.

In accordance with Formula 1, one way to increase the refractive index R would be to increase the number of laminated layers of material having a large difference between refractive indices nL and nH. In this case, a vacuum deposition method may be employed to form a laminated layer. Since material having permeability higher than about 80% in a visible radiation region may have a refractive index n of about 1.2 to 4.0, a material with a relatively large refractive index difference within a range of about 1.2 to 4.0, for example, photo acryl and a nitride (SiN) may be employed. Moreover, in order to effectively prevent the ultraviolet radiation from permeating, thicknesses of the materials having different refractive indices may be preferably deposited to be about λ/4 of a wavelength (for example, about 200 nm to about 400 nm) of ultraviolet radiation used to cure the organic films 22a and 126a. Here, an optical thickness may be determined by multiplication of the refractive index and the thickness of material to be deposited, for example.

Since the ultraviolet radiation are not projected onto the OLED during the forming of the organic thin films 22a and 126a when the reflective layers 20 and 124 are formed on the upper side of the OLED display, reduction of electrical characteristics of the OLED may be prevented or reduced.

In an embodiment employing a glass substrate with a refractive index of about 1.6, the thin films 20a and 124a with a low refractive index may be selected from one or more of a photo acryl with a refractive index nL of about 1.5, $BaF_2$ of about 1.47, CsF of about 1.48, $Na_5Al_3F_{14}$ of about 1.33, KCl of about 1.49, SiO of about 1.6, and $Alq_3$ of about 1.7, and the thin films 20b and 124b with a high refractive index may selected from one or more of a silicone nitride (SiN) with a refractive index nH of about 2.0, $Cu_2O$ of about 2.71, $Fe_2O_3$ of about 3.01, $TiO_2$ of about 2.616, and ZnSe of about 2.89. In this case, the reflective layers 20 and 124 have a high refractive index of about 82%. Moreover, in another embodiment of the present invention, since transmittance of the ultraviolet radiation may be further decreased when the cathode electrodes 18 and 122 of the OLED may be formed to be translucent with a thin film such as Ag and Mg, further reduction in the effects of UV radiation may be realized.

As described above, if the reflective layer is formed by laminating materials with different refractive indices on the upper side of the OLED, the ultraviolet radiation may not be projected on the OLED during the forming of the organic thin film for the thin film encapsulation layer. Therefore, the electric characteristics of the organic layer may not be changed or may be minimally changed due to the projection of the ultraviolet radiation so that luminance characteristics and lifespan can be increased.

Although embodiments of the present invention have been shown and described, it should be appreciated by those skilled in the art that changes might be made in this embodiment without departing from the principles and spirit of the invention, the scope of which is defined in the claims and their equivalents.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light emitting diode (OLED) display, comprising:
   a substrate;
   an OLED including an anode electrode, a cathode electrode and an organic thin film formed between the anode electrode and the cathode electrode;
   a reflective layer directly on the OLED, the reflective layer comprising a laminated first material and second material, the first material and the second material having different refractive indices; and
   an encapsulation layer on the reflective layer, the encapsulation layer comprising at least one of an organic thin film and an inorganic thin film, and the organic thin film including a cured liquid monomer exposed to radiation.

2. The OLED display as claimed in claim 1, wherein the refractive indices of the first material and the second material of the reflective layer have a relative difference within a range of approximately 1.2 to 4.0.

3. The OLED display as claimed in claim 1, wherein the first material of the reflective layer includes one or more of a photo acryl, $BaF_2$, CsF, $Na_5Al_3F_{14}$, KCl, SiO, and $Alq_3$, and the second material of the reflective layer includes one or more of a silicone nitride (SiN), $Cu_2O$, $Fe_2O_3$, $TiO_2$, and ZnSe.

4. The OLED display as claimed in claim 1, wherein the organic thin film of the encapsulation layer includes an ultraviolet radiation curing material, and the cured liquid monomer of the organic thin film is exposed to ultraviolet radiation.

5. The OLED display as claimed in claim 4, wherein an optical thickness of the first material and the second material of the reflective layer is about $\lambda/4$ of a wavelength of ultraviolet radiation used to cure the organic film of the encapsulation layer.

6. The OLED display as claimed in claim 1, further comprising a thin film transistor formed on the substrate and coupled with the anode electrode.

7. The OLED display as claimed in claim 1, wherein the cathode electrode is translucent.

8. The OLED display as claimed in claim 1, wherein:
   the reflective layer is between the encapsulation layer and the OLED, and
   the encapsulation layer is a stacked layer of the organic thin film and the inorganic thin film.

9. The OLED display as claimed in claim 1, wherein:
   the reflective layer is between the liquid monomer of the encapsulation layer and the cathode electrode, and
   the encapsulation layer is a stacked layer of the organic thin film and the inorganic thin film.

10. The OLED display as claimed in claim 1, wherein the OLED, the first material of the reflective layer, the second material of the reflective layer, the organic thin film of the encapsulation layer, and the inorganic thin film of the encapsulation layer are sequentially stacked.

11. The OLED display as claimed in claim 10, wherein the first material has a first refractive index that is lower than a second refractive index of the second material.

12. The OLED display as claimed in claim 11, wherein the cured liquid monomer is a UV-cured liquid monomer directly on the second material of the reflective layer.

13. The OLED display as claimed in claim 4, wherein the cured liquid monomer is a UV-cured liquid monomer directly on the reflective layer.

* * * * *